US006771143B2

(12) United States Patent
Stein et al.

(10) Patent No.: US 6,771,143 B2
(45) Date of Patent: Aug. 3, 2004

(54) DEVICE FOR COUPLING RADIO FREQUENCY ENERGY FROM VARIOUS TRANSMISSION LINES USING VARIABLE IMPEDANCE TRANSMISSION LINES

(75) Inventors: Richard P. Stein, Princeton, TX (US); Richard D. English, Princeton, TX (US); James W. McCoy, Plano, TX (US)

(73) Assignee: InnerWireless, Inc., Richardson, TX (US)

( * ) Notice: Subject to any disclaimer, the term of this patent is extended or adjusted under 35 U.S.C. 154(b) by 123 days.

(21) Appl. No.: 10/099,329

(22) Filed: Mar. 15, 2002

(65) Prior Publication Data

US 2004/0017265 A1 Jan. 29, 2004

Related U.S. Application Data

(63) Continuation-in-part of application No. 09/563,328, filed on May 3, 2000.

(60) Provisional application No. 60/169,722, filed on Dec. 8, 1999.

(51) Int. Cl.[7] .............................. H01P 5/12; H03H 5/10; H03H 7/38

(52) U.S. Cl. ............................ 333/125; 333/27; 333/33

(58) Field of Search ............................... 33/125, 27, 33

(56) References Cited

U.S. PATENT DOCUMENTS

| | | | | |
|---|---|---|---|---|
| 4,554,608 | A | * | 11/1985 | Block |
| 5,729,184 | A | * | 3/1998 | Paxman et al. |
| 5,734,355 | A | * | 3/1998 | Watanabe |

* cited by examiner

*Primary Examiner*—Patricia Nguyen
(74) *Attorney, Agent, or Firm*—Haynes and Boone, LLP

(57) ABSTRACT

An apparatus and method for coupling energy from a transmission line is provided. The apparatus includes a contact designed to “tap” into an inner conductor of the transmission line 100 through an aperture in an outer conductor of the transmission line. A portion of the contact may be coiled (e.g., a spring) and the coil’s characteristics may be varied to control the insertion loss and coupling loss of the apparatus. For example, the wire size, coil diameter, number of turns, and pitch design of the coil may be controlled. The apparatus may also include a secondary transmission line connected to the coil and the secondary transmission line may allow additional control over the coupled energy.

23 Claims, 6 Drawing Sheets

DEVICE FOR COUPLING RADIO FREQUENCY ENERGY FROM VARIOUS TRANSMISSION LINES USING VARIABLE IMPEDANCE TRANSMISSION LINES

CROSS-REFERENCE TO RELATED APPLICATION

This application is a continuation-in-part of U.S. patent application Ser. No. 09/563,328, filed May 3, 2000, which claims the benefit of U.S. Provisional Patent Application No. 60/169,722, filed Dec. 8, 1999.

FIELD OF THE INVENTION

The present invention relates in general to radio frequency devices and in particular to methods and devices for coupling radio frequency energy from transmission lines.

DESCRIPTION OF THE RELATED ART

Until this invention, coaxial taps and couplers were installed by cutting and connectorizing RF cable using coaxial jumpers. The primary disadvantage of this methodology is the resulting excessive loss to the host cable. Stein et al, U.S. Pat. No. 5,729,184, subsequently taught that a tap can be used without connectorization; however, the Stein et al. invention still caused losses of over 1 dB to the host cable. Stein et al did mention the theoretical ability to devise taps with coupling losses up to 20 dB but did not describe a method for the manufacture of such devices.

What is needed are methods and devices embodying the ability to select the coupling loss and accompanying insertion loss in RF systems. In particular, such methods and devices should allow a wireless system not only to be tuned but should also allow minimization of the number of amplifiers and active devices required to RF illuminate a structure.

SUMMARY OF THE INVENTION

The present invention relates generally to a coupling device for obtaining energy from a transmission line. In one embodiment, the coupling device comprises a contact for contacting an inner conductor of the transmission line through an aperture in an outer conductor of the transmission line. At least a portion of the contact includes a coil of a preselected configuration, where the configuration defines at least one property of the transferred energy. The coupling device also includes a connector having an inner conductor coupled to the contact.

In another embodiment, the coupling device includes a wire of a preselected configuration positioned between the contact and the connector. The wire is spaced from a ground plane to create a selected parasitic capacitance and the configuration of the wire at least partially defines a center frequency of the coupling device.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

Figure 1A:
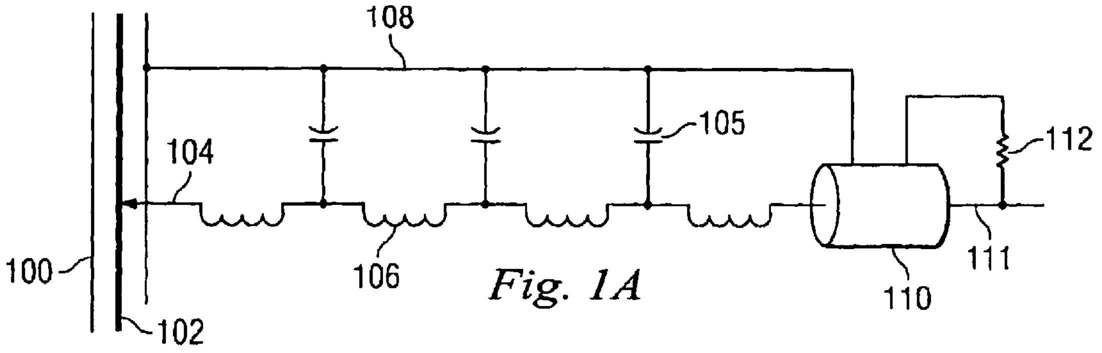
FIG. 1A is a schematic of a coupling device according to the principles of the invention.
Figure 1B:
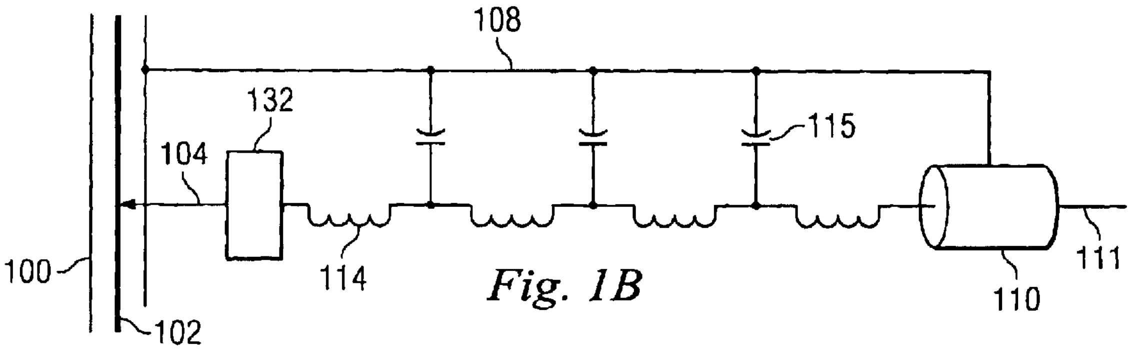
FIG. 1B is a schematic diagram of a second coupling device according to the principles of the invention.
Figure 1C:
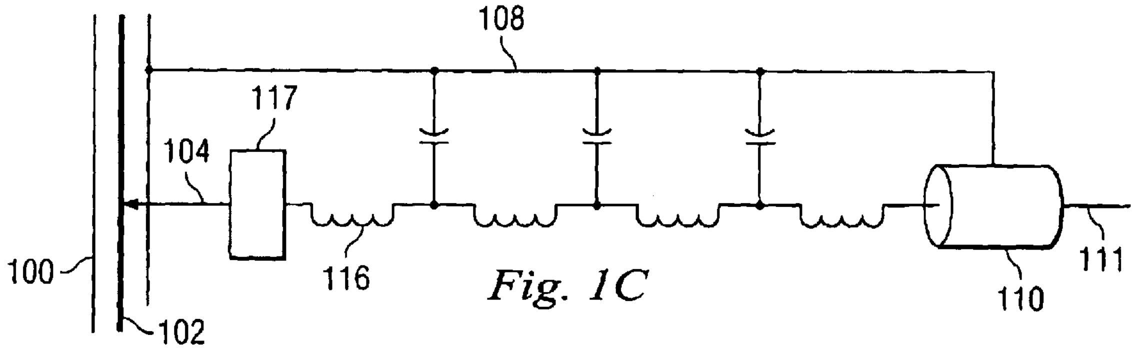
FIG. 1C is a schematic diagram of a third coupling device according to the principles of the invention.
Figure 1D:
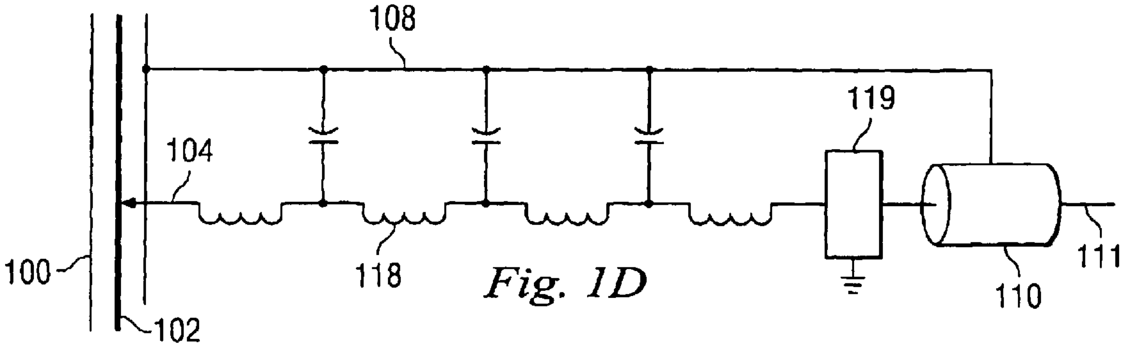
FIG. 1D is a schematic diagram of a fourth coupling device according to the principles of the invention.
Figure 2:
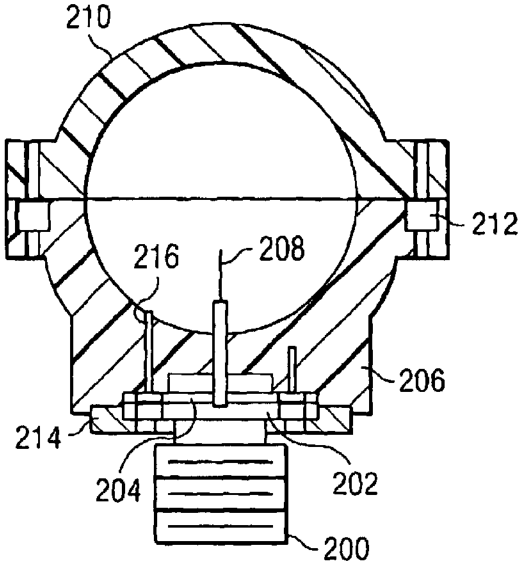
FIG. 2 shows an assembly and section view of the coupling device according to the principles of the invention.

The principles of the present invention and their advantages are best understood by referring to the illustrated embodiment depicted in FIGS. 1–3 of the drawings, in which like numbers designate like parts.

Figure 3A:
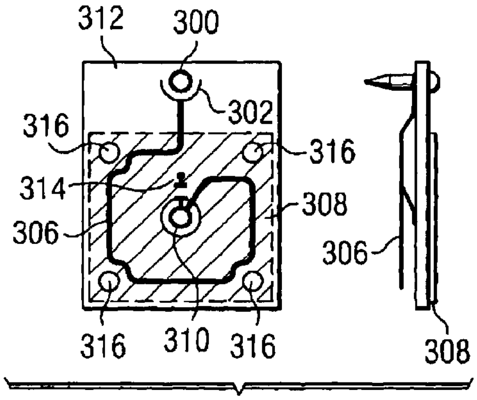
FIG. 3A shows an electronic assembly of an ultra low insertion loss, high coupling loss coupling device such as that shown schematically in FIG. 1B.
Figure 3C:
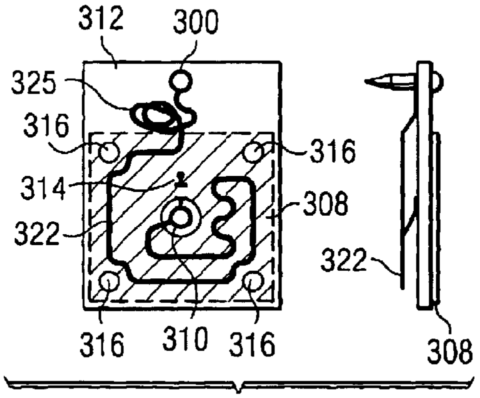
FIG. 3C shows an electronic assembly of a low insertion loss, low coupling loss coupling device such as that shown schematically in FIG. 1C.
Figure 3B:
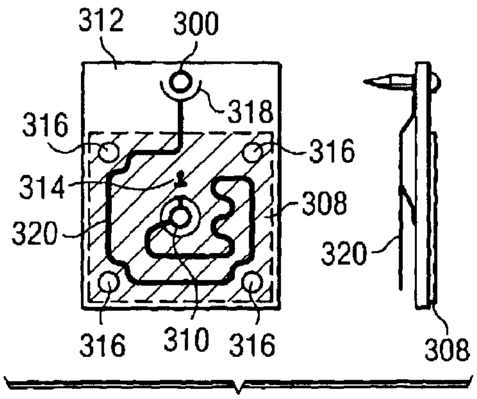
FIG. 3B shows an electronic assembly of a low insertion loss, medium coupling loss coupling device such as that shown schematically in FIG. 1B.
Figure 3D:
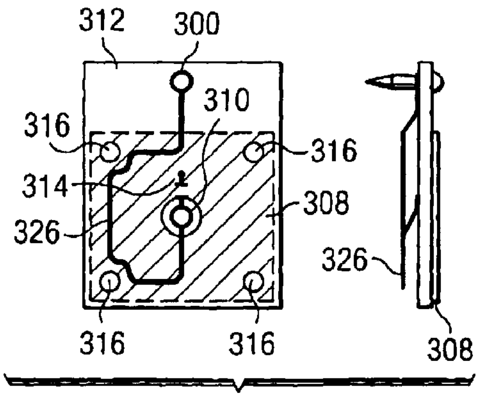
FIG. 3D shows an electronic assembly of a low insertion loss, high frequency coupling device such as that shown schematically in FIG. 1A.

FIGS. 1A and 3D respectively show a schematic and layout of a coupling device for coupling RF energy from a coaxial cable to a second coaxial cable, RF radiator or RF amplifier. Although a coaxial cable is represented, it is understood that any transmission line can be substituted and tapped. A hole is drilled into the host transmission line outer conductor 100 and a contact 104 (shown in FIG. 3D at 300) is inserted to make contact with the host transmission line center conductor 102. The contact might be spring loaded, but it is understood that any means of contacting the center conductor will suffice. It is preferable that the center conductor contact 104 (300) be insulated, but it is not necessary to meet the principles of the invention. Insulation on the shaft of the contact 104 (300) is provided to prevent inadvertent contact with the outer conductor 100.

The coupler internal transmission line 106 (shown in FIG. 3D at 326) is a low loss wire. The length and diameter of the wire determine the frequency response and to some degree, the coupling loss and insertion loss of the device. The transmission line wire may be insulated to allow longer length for lower frequencies and still meet the intent of the invention.

One principle of the invention is the use of highly conductive wire. This prevents dielectric loss through insulation.

The wire is connected to the center conductor pin 111 (310) of an output connector represented by outer conductor 110 and center conductor 111 (310). It is understood that the output may be a hard-wired cable, a directly connected antenna, amplifier or a dummy load. Any of these will meet the principles of the invention.

Loss element 112 (314) is connected between the center pin 111 (310) of the output connector and the outer shield 110 to provide a closer impedance match to the device connected to the output connector. The loss element adds to the performance of the invention, but is not required to meet the principles of the invention.

The configuration of FIGS. 1A and 3D are used for coupling devices with coupling values from near −15 dB to −6 dB. The loss element of the internal transmission line 106 (306) is a low loss, wire. The length and diameter of the wire determine the frequency response and to some degree, the coupling loss and insertion loss of the device. The transmission line wire may be insulated to allow longer length for lower frequencies and still meet the intent of the invention. FIGS. 1B, 3A and 3B are respectively schematic and layout diagrams of an alternate coupling device for coupling a minimum amount of RF energy from a host cable to an output connector while minimizing the insertion loss in the host cable in accordance with the principles of the invention.

A hole is drilled into the host transmission line outer conductor 100 and a contact 104 (300) is inserted to make contact with the host transmission line center conductor 102. The contact might be spring loaded, but it is understood that any means of contacting the center conductor will suffice. It is preferable that the center conductor contact 102 be insulated, but it is not necessary to meet the principles of the invention.

The internal transmission line 114 (306 and 320 in FIGS. 3A and 3B) is a low loss, non-insulated wire but may be insulated for longer lengths to accommodate lower frequencies and still meet the principles of the invention. The transmission line wire is not to be in contact with any dielectric except where it is connected to the terminal points.

The configuration of FIGS. 1A and 3D are used for coupling devices with coupling values from near −15 dB to −6 dB. The loss element of the internal transmission line 106 (326) is a low loss wire. The length and diameter of the wire determine the frequency response and to some degree, the coupling loss and insertion loss of the device. The parasitic capacitors 105 are formed by the diameter of the wire and the distance from a ground plane 108 (308) (202, FIG. 2) shown in FIG. 3D. The parasitic capacitance and the configuration of the wire determine the center frequency response of the device. The transmission line wire may be insulated to allow longer length for lower frequencies and still meet the intent of the invention. As shown in FIG. 3D, the PC board 312 includes holes 316 for purposes that will be described One principle of the invention is the use of highly conductive wire. This prevents dielectric loss through insulation. Still another principle of the invention is to prevent the transmission line wire from contacting any dielectric surface except at the point of connection.

The wire is connected to the center conductor pin 111 (310) of an output connector represented by outer conductor 110 and center conductor 111 (310). It is understood that the output may be a hard-wired cable, a directly connected antenna, amplifier or a dummy load. Any of these will meet the principles of the invention.

A further principle of the invention is to not connect the transmission line to the center contact 102 (300), but using capacitive coupling, sample the field around pin 102 as shown in detail in FIGS. 3A and 3B at 302 and 318. The greater the sampling, the greater the coupling energy.

In FIG. 1B, an element 132 represents a complex impedance, dc blocked connection between the transmission line 114 and the pin 104 connecting the center conductor 102 of the host cable. This connection is further shown in FIGS. 3A and 3B. As seen in FIG. 3A, the connection can be small allowing a small amount of power to be coupled (from 20 to 30 dB) or larger per FIG. 3B allowing coupling values of from 15 to 20 dB. The high coupling loss causes insertion losses from 0.3 to 0.05 dB.

The configuration of FIGS. 1C and 3C allows a coupling device to pass several selected frequencies with accompanying low insertion loss at those frequencies. In FIG. 1C the internal transmission line is shown at 116 and in FIG. 3C at 322. The lumped impedance 117 on FIG. 1C and the coil 325 shown in FIG. 3C allows the coupling device to be configured to emphasize selected frequencies while minimizing the insertion loss at selected frequencies.

A further principal of this invention is that using the lumped impedance input, such as shown in FIGS. 1C and 3C and the selected coupling of FIGS. 1B and 3A and 3B, allows the designer to not only select the coupling, insertion loss, but also allows him or her to select the required frequencies so that several frequencies can be sent and received on the same cable.

FIG. 1D generally relates to this invention with a dc blocked, complex impedance 119 at the input of the coupled port. This allows the designer to configure the coupling device to customize the return loss and to some extent the frequency response. Here, the transmission line (internal) is shown at 118.

FIG. 3D generally relates to the invention for coupling devices used for single frequencies at frequencies around 2 GHz. The principals requiring different wire sizes to select the coupling loss and insertion loss apply to this device as for the other devices described herein. It is understood that any combination of the principals of this invention are included as part of this invention.

FIG. 2 generally relates to the mechanical aspects of the invention. The package consists of 3 plastic parts, the bottom 210, the top 206 and the top seal 214. The coupled port connector 200 is shown as a type "N", but any applicable RF connector can be used. The connection to the coupled port may also be a "clamp-on" or "hard-wired". The connection to the host cable is 208, but it is understood that any probe or other means of contacting the host center conductor will meet the principals of the invention.

Captive screws 212 are used to connect the top and bottom of the device to the host cable. Captive screws are used to facilitate installation.

Screws 216 are disposed on opposite corners of the connector flange extending through holes 316 in PC board 312 (204, FIG. 2), and act as anti-rotation as well as providing a ground path from the host cable to the outer conductor of the coupled port. Although the anti-rotation is not required to allow the device to function, it adds to the overall strength. The ground is not required for operations above 400 mHz, but does add to the overall electrical stability. The screws 216 will generally be partially installed at the time of manufacture and will be finally installed at the time of installation.

Referring now generally to FIGS. 4–9, further embodiments are illustrated and will be discussed in greater detail.

Figure 4A:
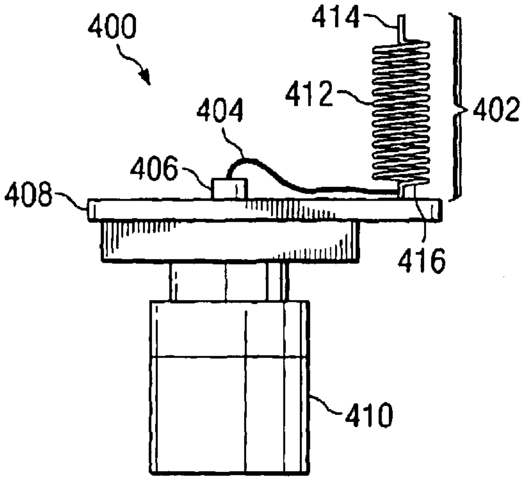
FIGS. 4A and 4B illustrate a cutaway side view and a top view, respectively, of a fifth coupling device.
Figure 4B:
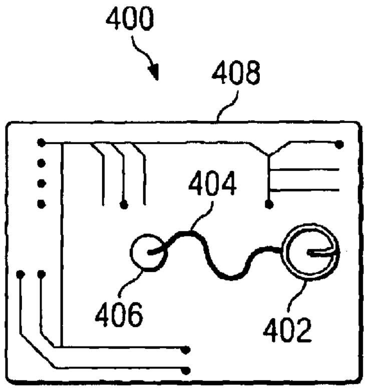

Referring now to FIGS. 4A and 4B, in one embodiment, a coupling device 400 utilizes a wire-wound coil 402 (e.g., a spring) to contact a center conductor of a coaxial cable (not shown). The coupling device 400 may include a housing comprising a plastic or non-ferromagnetic material, but the housing is not shown for purposes of clarity. The spring 402 may comprise a non-ferromagnetic material of constant or variable pitch. In the present example, the spring 402 includes a coiled portion 412, a relatively straight extension 414 at the top of the coiled portion 412, and a relatively straight extension 416 at the bottom of the coiled portion 412. The wire diameter, coil diameter, and number of turns of the spring 402 may be selected based on desired results such as coupling and insertion loss.

The bottom extension 416 of the spring 402 is connected through a secondary transmission line 404 to a center conductor pin 406. A printed circuit board (PCB) 408 may be used to provide a mounting surface for the spring 402, secondary transmission line 404, and center conductor pin 408. In the present example, an RF interface connector 410 is mounted on the side opposite the spring 402 and is connected to the spring 402 through the center conductor pin 408 and secondary transmission line 404. One or more apertures (not shown) in the PCB 408 may provide signal connection pathways between the two sides of the PCB 408, as well as mounting holes.

In operation, the spring 402 may transform an impedance level from a characteristic transmission line impedance (e.g., approximately fifty or seventy-five ohms) of the coaxial cable to a higher desired value. The transformation is accomplished primarily in the imaginary plane and the complex impedance of the spring 402 establishes the overall frequency response and the amount of energy extracted from the coaxial cable. More specifically, the transformation is in the imaginary plane because the complex impedance is mostly series inductance with parasitic, turn-to-turn, capacitance. Accordingly, there is generally little or no resistive, real plane, component to the impedance.

The ratio of the magnitude of the complex impedance to the transmission line impedance governs the amount of energy extracted from the transmission line. This complex impedance is, in part, a function of the diameter, pitch, number of turns, and wire size of the spring 402. In addition, the top and bottom extensions 414, 416 of the spring 402 enable a second order control of the total complex impedance. Furthermore, the secondary transmission line 404 may be used to complete the complex impedance transformation to achieve the desired value. For example, the secondary transmission line 404 may control the frequency response and the power extracted from/inserted to the coax cable.

Figure 5A:
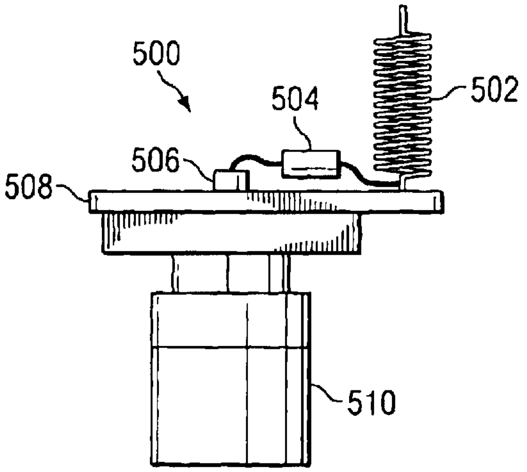
FIGS. 5A and 5B illustrate a cutaway side view and a top view, respectively, of a sixth coupling device.
Figure 5B:
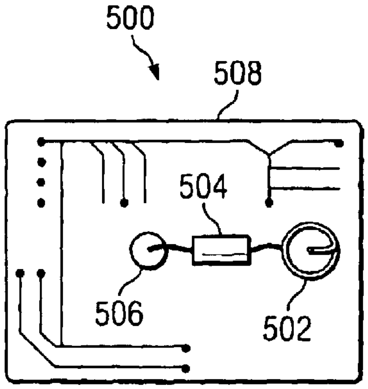

Referring now to FIGS. 5A and 5B, in another embodiment, a coupling device 500 includes a coil 502, a secondary transmission line 504, a center conductor pin 506, a PCB 508, and an RF interface connector 510 that are connected in a similar manner to that described in reference to FIGS. 4A and 4B. In the present example, the secondary transmission line 504 may be provided in any configuration that allows the desired complex impedance over the required frequency band or bands. For example, while the coil 502 serves as the primary impedance transformer, the secondary transmission line 504 can be a transmission line or any passive component (such as a lumped element resistor, capacitor, or inductor) that may be used to achieve a desired insertion and coupling loss.

Figure 6A:
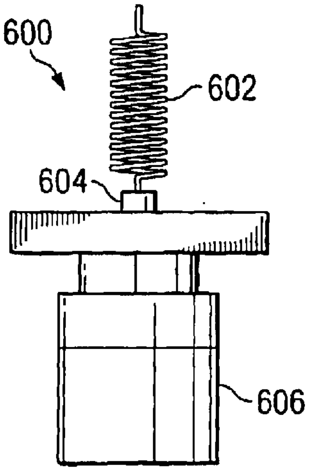
FIGS. 6A and 6B illustrate a cutaway side view and a top view, respectively, of a seventh coupling device.
Figure 6B:
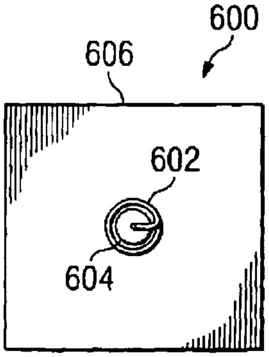

Referring now to FIGS. 6A and 6B, in yet another embodiment, a coupling device 600 includes a coil 602, which may be similar to the coils 402 and 502 described in reference to FIGS. 4 and 5, respectively. The coil 602 may comprise a single non-ferromagnetic coil of fixed or variable pitch and may have a fixed or variable diameter. The coil 602 is attached directly to a center pin 604 of an RF interface connector 606. As previously described, the insertion loss and coupling loss of the coupling device 600 may be determined by the wire size, coil diameter, number of turns, and pitch design of the coil 602.

The present example may be constructed without the use of a PCB. This may simplify the manufacture of the coupling device 600, reduce costs, and provide similar benefits. In addition, the direct connection of the coil 602 to the RF interface connector 606 may prevent energy losses that may occur if the connection is routed through a PCB. Furthermore, the frequency response enabled by the coil 602 may be broadband. The broadband frequency response may occur partly because the direct connection approach described above removes the circuit board and precludes the use of a secondary coil/transmission line, which reduces the total secondary/parasitic impedance. This reduction allows the self resonance of the coil 602 to be moved up in frequency (out of the band of interest), resulting in a broadband frequency response.

Figure 7A:
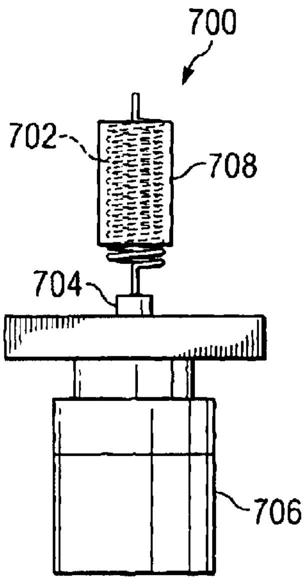
FIGS. 7A–7C illustrate a cutaway side view, a top view, and a close up view, respectively, of an eighth coupling device.
Figure 7B:
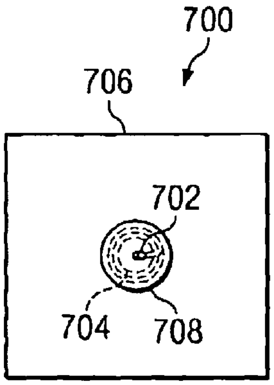
Figure 7C:
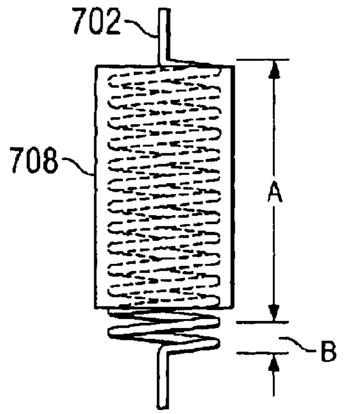

Referring now to FIGS. 7A–7C, in still another embodiment, a coupling device 700 includes a coil 702 that is attached directly to a center pin 704 of an RF interface connector 706. A portion of the coil 702 may be encapsulated in a material 708, such as a low-loss plastic (e.g., polystyrene). In the present example, the majority of the upper portion of the coil 702 is encapsulated, while a smaller portion near the bottom is not.

The upper portion of the coil 702 acts as the principal impedance transformer and its complex impedance may be held invariant by mechanically constraining the dimensions of the coil with the material 708. The lower portion of the spring 702 acts as a secondary impedance transformer but is allowed to compress, as it is the portion of the coil 702 that maintains contact with the center conductor of the host cable. Referring specifically to FIG. 7C, for purposes of illustration, the coil 702 comprises fourteen turns of American Wire Gauge (AWG) 25 wire with an outer diameter of 0.120 inches. The portion of the coil 702 denoted by the reference numeral "A" represents the upper 12.5 turns and is encapsulated by the material 708. The portion of the coil 702 denoted by the reference numeral "B" represents the lower 1.5 turns and is not encapsulated.

This encapsulating feature enables control over the coil 702 while allowing the coupling device 700 to be mounted on coaxial cables with varying dielectric jacket thickness (e.g., the unencapsulated portion can compress or expand to engage a cable). Furthermore, the frequency response enabled by the coil 702 may be broadband. The broadband frequency response may occur partly because the direct connection approach described above removes the circuit board and precludes the use of a secondary coil/transmission line, which reduces the total secondary/parasitic impedance. This reduction allows the self resonance of the coil 702 to be moved up in frequency (out of the band of interest), resulting in a broadband frequency response.

Figure 8:
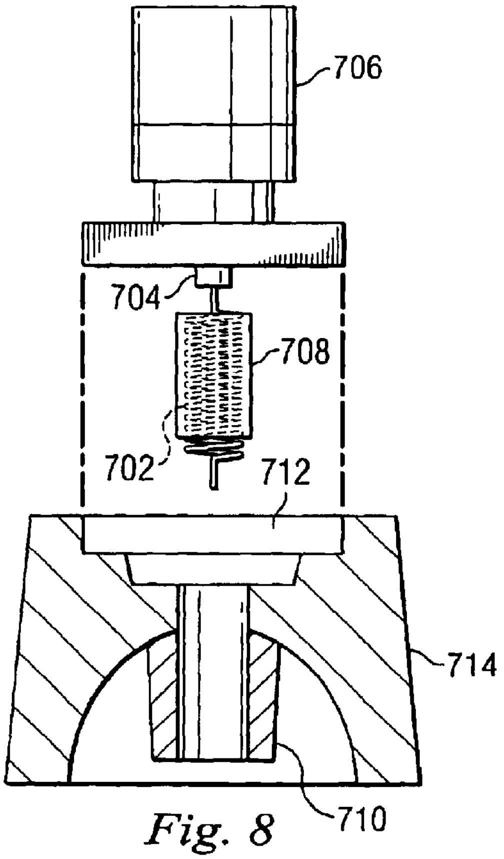
FIG. 8 illustrates an alternative embodiment of the coupling device of FIGS. 7A–7C.

Referring now to FIG. 8, in still another embodiment, the coupling device 700 of FIGS. 7A–7C includes a tubular extension 710 that may extend from the device 700 into the coaxial cable. The extension 710 may be formed as a part of the coupling device 700 or may be added as a separate component. The extension 710 may serve a variety of functions such as acting as a stabilizer for the coil 702 and as an anti-rotation device.

In addition, a cavity 712 may be provided in the housing 714 of the coupling device 700. The cavity 712 may be sized to adjust the parasitic capacitance, which serves to fine-tune the frequency response. More specifically, the cavity 712 may form an electromagnetic resonant circuit. When the coil 702 (or a transmission line) is introduced inside the cavity 712, the fields surrounding the coil 702 are constrained (e.g., there are electromagnetic boundary conditions that may not exist in an unconstrained space). Accordingly, the cavity 702 will exhibit a largely imaginary complex impedance, which may be capacitive.

Figure 9:
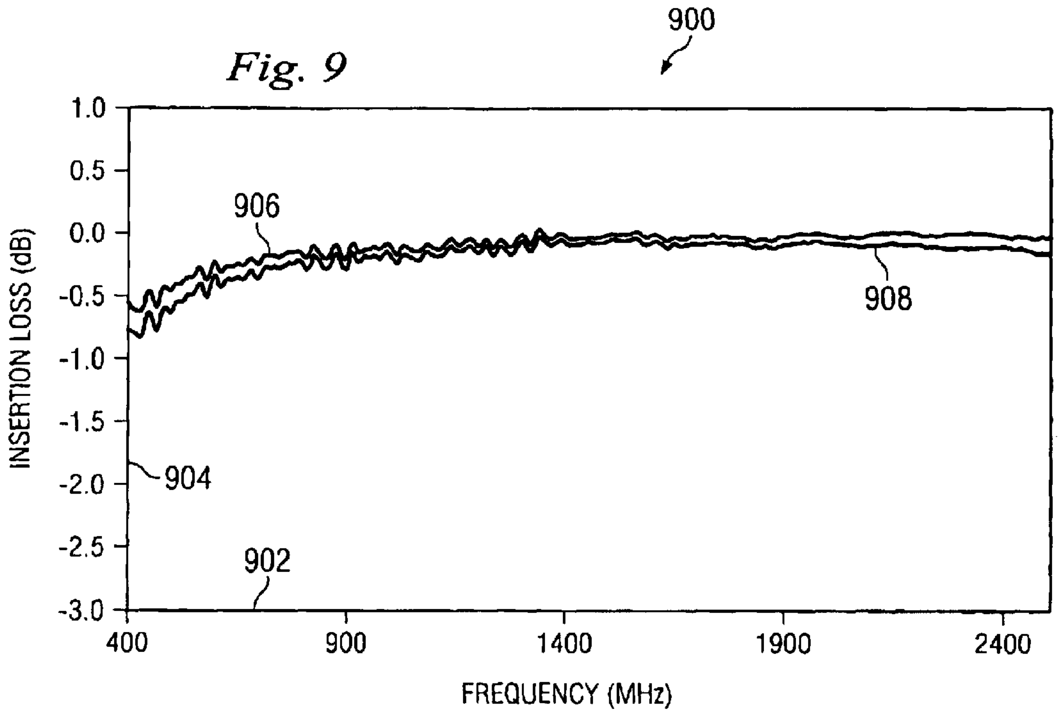
FIG. 9 is a graph illustrating two representative samples of insertion loss using variations of the coupling device of FIG. 8.

Referring now to FIG. 9, a representative insertion loss from a tap is illustrated by a graph 900. The graph 900 includes an x-axis 902 representing frequency in MHz and a y-axis 904 representing insertion loss in dB. Two samples 906 and 908 each represent an exemplary behavior pattern of two different variations of the coupling device 700 of FIG. 8. The exemplary behavior of the sample 906 illustrates a result when a nominal amount of power is being extracted, while the sample 908 illustrates a result when the amount of power being extracted is increased by approximately 3 dB.

Figure 10:
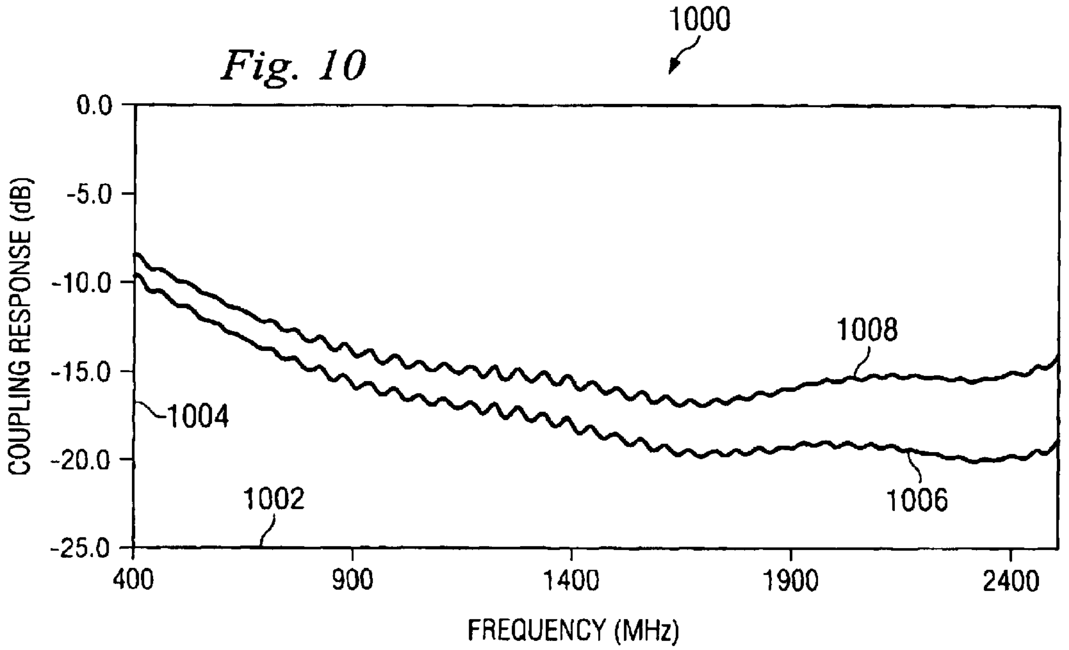
FIG. 10 is a graph illustrating two representative samples of coupling responses using variations of the coupling device of FIG. 8.

Referring now to FIG. 10, a representative coupling response from a tap is illustrated by a graph 1000. The graph 1000 includes an x-axis 1002 representing frequency in MHz and a y-axis 1004 representing coupling loss in dB. Two samples 1006 and 1008 each represent an exemplary behavior pattern of two different variations of the coupling device 700 of FIG. 8. The exemplary behavior of the sample 1006 illustrates a result when a nominal amount of power is being extracted, while the sample 1008 illustrates a result when the amount of power being extracted is increased by approximately 3 dB.

The samples 906, 908 and 1006, 1008 in the graphs of FIGS. 9 and 10, respectively, are based on two variations of FIG. 8. The samples 906 and 1006 are the corresponding results from a single variation, and the samples 908 and 1008 result from an additional variation. For example, the variation represented by the samples 906 and 1006 may be created with a baseline coil length, coil inner diameter, coil wire size, and coil number of turns. Having established this baseline, the samples 908 and 1008 may result when a variation is created with the same coil length but 20 percent reduction in coil turns, 10 percent increase in coil diameter, and a 5 percent increase in coil wire size. Both variations are based on constant diameter and constant pitch coils. Similar results can be achieved by utilization of one or both of these parameters instead of, or in combination with, the parameters that were varied. Furthermore, it is understood that a variety of parameters may be utilized to produce a desired variation.

Figure 11A:
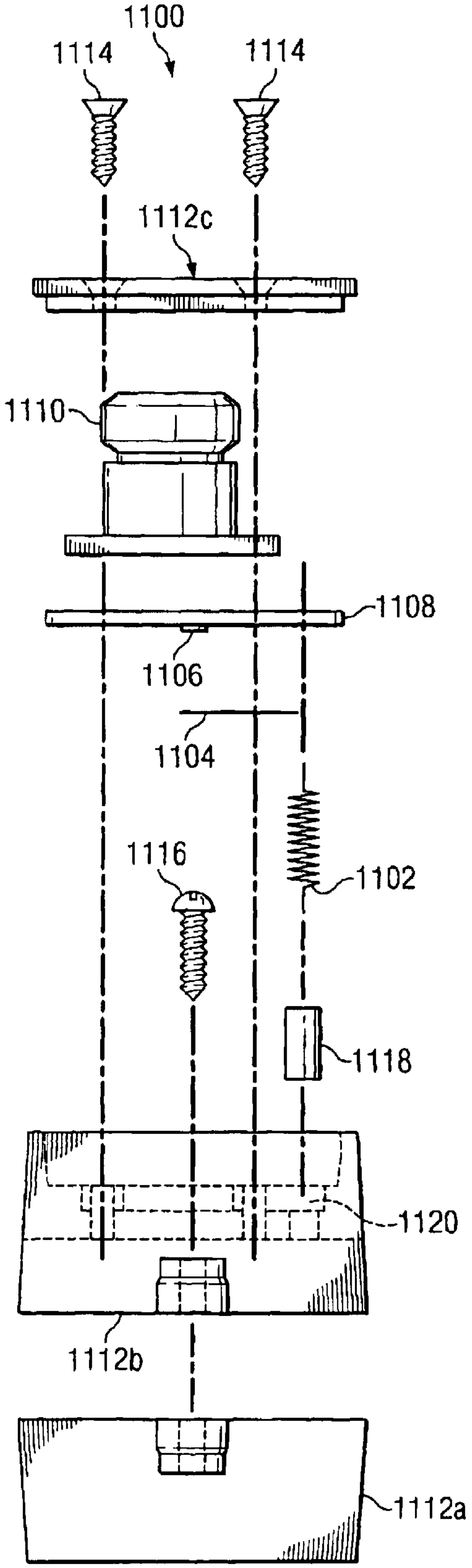
FIGS. 11*a–c* illustrate a cutaway unassembled side view, an assembled side view, and a top view, respectively, of a ninth coupling device.
Figure 11B:
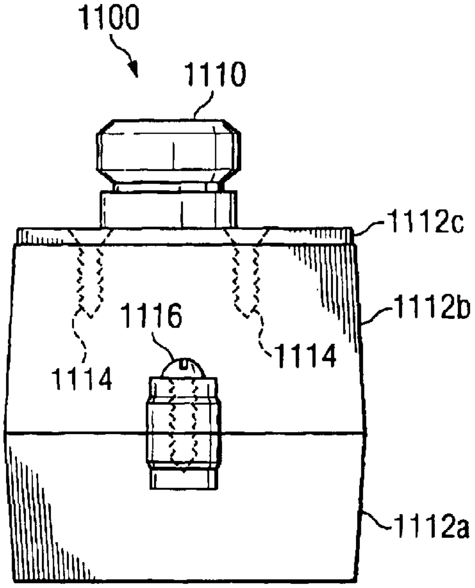
Figure 11C:
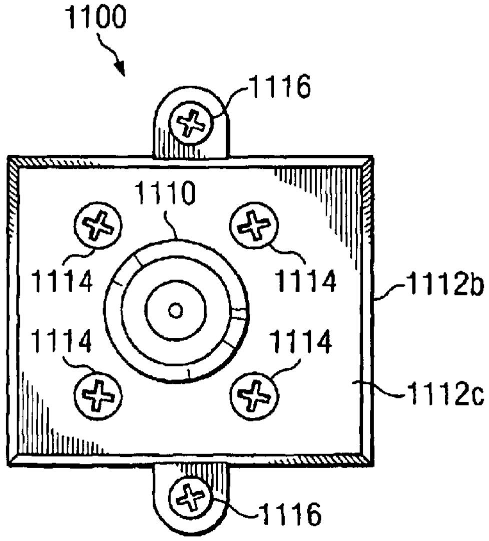

Referring now to FIGS. 11*a–c*, in still another embodiment, an exemplary coupling device 1100 includes a coil 1102, a secondary transmission line 1104, a center conductor pin 1106, a PCB 1108, and an RF interface connector 1110 that are connected in a similar manner to that described in reference to FIGS. 4 and 5. As described previously, the secondary transmission line 1104 may be provided in any configuration that allows the desired complex impedance over the required frequency band or bands. For example, while the coil 1102 serves as the primary impedance transformer, the secondary transmission line 1104 can be a transmission line or any passive component (such as a lumped element resistor, capacitor, or inductor) that may be used to achieve a desired insertion and coupling loss.

The device 1100 includes a housing 1112. In the present example, the housing 1112 comprises a lower housing 1112*a*, an upper housing 1112*b*, and a top plate 1112*c*. The top plate 1112*c* may be fastened to the upper housing 1112*b* by a plurality of screws 1114 and the upper housing 1112*b* may be fastened to the lower housing 1112*a* by a plurality of screws 1116. Other fastening means may be used to replace or complement the screws 1114 and 1116.

The device 1100 may also include a tubular extension 1118 and a cavity 1120 as described in reference to FIG. 8. The tubular extension 1118 may extend from the device 1100 into the coaxial cable. The extension 1118 may be formed as a part of the coupling device 1118 or may be added as a separate component. The extension 1118 may serve a variety of functions such as acting as a stabilizer for the coil 1102 and as an anti-rotation device. The cavity 1120 may be provided in the housing 1112 of the coupling device 1100. For example, the cavity may be formed in the upper housing 1112*b* as illustrated. The cavity 1120 may be sized to adjust the parasitic capacitance, which serves to fine-tune the frequency response as previously described.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. It is therefore, contemplated that the claims will cover any such modifications or embodiments that fall within the true scope of the invention.

What is claimed:

1. A coupling device for obtaining energy from a transmission line, the coupling device comprising:

a contact for contacting an inner conductor of said transmission line through an aperture in an outer conductor of said transmission line, wherein at least a portion of the contact includes a coil of a preselected configuration, said configuration defining at least one property of the transferred energy; and a connector having an inner conductor coupled to said contact.

2. The coupling device of claim 1 further including a wire of a preselected configuration positioned between said contact and said connector, wherein said wire is spaced from a ground plane to create a selected parasitic capacitance, said configuration of said wire operable to at least partially define a center frequency of said coupling device.

3. The coupling device of claim 2 wherein the wire is a passive component.

4. The coupling device of claim 1 further including:

a housing; and a cavity located in said housing proximate to the contact, wherein said cavity is operable to effect the parasitic capacitance.

5. The coupling device of claim 1 further including an enclosure surrounding at least a portion of the coil, wherein said enclosure mechanically restrains the enclosed portion of the coil.

6. The coupling device of claim 1 wherein said coil has a variable pitch.

7. The coupling device of claim 1 wherein said coil has a variable diameter.

8. The coupling device of claim 1 wherein the at least one energy property defined by the coil configuration is selected from the group consisting of a frequency, a coupling loss, and an insertion loss.

9. The coupling device of claim 1 wherein the contact further includes a first straight end and a second straight end positioned on opposite ends of said coil, wherein said first straight end engages said transmission line and said second straight end is coupled to said inner connector.

10. A radio frequency coupling device comprising:

a circuit, the circuit comprising:

a contact operable to engage a transmission line for transferring energy, the contact including a coiled portion configured to define at least one property of the transferred energy;

a conductor pin coupled to the contact; and an interface connector coupled to the conductor pin; and a housing formed around at least a portion of the circuit.

11. The radio frequency coupling device of claim 10 wherein the housing further includes an extension extending from the radio frequency coupling device into the transmission line, the extension at least partially surrounding the contact and operable to limit a lateral movement of the contact relative to the housing.

12. The radio frequency coupling device of claim 11 wherein the extension is tubular.

13. The radio frequency coupling device of claim 11 wherein the extension is operable to prevent rotation of the radio frequency coupling device relative to the transmission line.

14. The radio frequency coupling device of claim 10 further including a wire positioned between the contact and the conductor pin, the wire separated at least in part from a ground plane by an air gap and configured to further define at least one property of the transferred energy.

15. The radio frequency coupling device of claim 10 further including a cavity located in the housing proximate to the contact, wherein the cavity is sized to adjust a parasitic capacitance of the radio frequency coupling device.

16. A method of coupling energy from a transmission line having separated inner and outer conductors, the method comprising:

forming an aperture through the outer conductor of the transmission line to expose a portion of the inner conductor;

inserting a coiled contact through the aperture;

altering the position of the coiled contact relative to the inner conductor to engage the inner conductor, the alteration occurring automatically due to the coiled contact;

and electrically coupling the coiled contact with an interface.

17. The method of claim 16 further including inserting an extension into the transmission line.

18. The method of claim 16 further including altering at least one property of the transferred energy using the coil.

19. The method of claim 16 wherein electrically coupling the coiled contact with the interface includes providing a wire positioned between the coiled contact and the interface.

20. A coupling device for obtaining energy from a transmission line, the coupling device comprising:

a contact for contacting an inner conductor of said transmission line through an aperture in an outer conductor of said transmission line, wherein at least a portion of the contact includes a coil of a preselected configuration, said coil having a variable pitch, said configuration defining at least one property of the transferred energy; and a connector having an inner conductor coupled to said contact.

21. A coupling device for obtaining energy from a transmission line, the coupling device comprising:

a contact for contacting an inner conductor of said transmission line through an aperture in an outer conductor of said transmission line, wherein at least a portion of the contact includes a coil of a preselected configuration, said coil having a variable diameter, said configuration defining at least one property of the transferred energy; and a connector having an inner conductor coupled to said contact.

22. A radio frequency coupling device comprising:

a circuit, the circuit comprising:

a contact operable to engage a transmission line for transferring energy, the contact including a coiled portion configured to define at least one property of the transferred energy;

a conductor pin coupled to the contact; and an interface connector coupled to the conductor pin; and a housing formed around at least a portion of the circuit, the housing including an extension extending from the radio frequency coupling device into the transmission line, the extension at least partially surrounding the contact and operable to limit a lateral movement of the contact relative to the housing and to prevent rotation of the radio frequency coupling device relative to the transmission line.

23. A radio frequency coupling device comprising:

a circuit, the circuit comprising:

a contact operable to engage a transmission line for transferring energy, the contact including a coiled portion configured to define at least one property of the transferred energy;

a conductor pin coupled to the contact; and an interface connector coupled to the conductor pin; and a housing formed around at least a portion of the circuit and including a cavity located in the housing, proximate to the contact, wherein the cavity is sized to adjust a parasitic capacitance of the radio frequency coupling device.

* * * * *